United States Patent [19]

Myers

[11] Patent Number: 4,616,145

[45] Date of Patent: Oct. 7, 1986

[54] ADJUSTABLE CMOS HYSTERESIS LIMITER

[75] Inventor: Brent A. Myers, Lynchburg, Va.

[73] Assignee: General Electric Company, Lynchburg, Va.

[21] Appl. No.: 595,738

[22] Filed: Apr. 2, 1984

[51] Int. Cl.[4] .............................................. H03K 5/08
[52] U.S. Cl. .................................. 307/555; 307/261; 307/362
[58] Field of Search ............... 307/261, 290, 353, 350, 307/354, 362, 540, 555, 355; 328/164

[56] References Cited

U.S. PATENT DOCUMENTS

| | | |
|---|---|---|
| 3,660,774 | 5/1972 | Eachus . |
| 3,676,702 | 7/1972 | McGrogan, Jr. . |
| 3,749,942 | 7/1973 | Moses .................................. 307/362 |
| 3,988,595 | 10/1976 | Eatock . |
| 4,068,138 | 1/1978 | Miyakawa et al. . |
| 4,110,641 | 8/1978 | Payne . |
| 4,211,942 | 7/1980 | Aoki et al. . |
| 4,237,390 | 12/1980 | Buurma . |
| 4,323,887 | 4/1982 | Buurma . |
| 4,375,039 | 2/1983 | Yamauchi . |
| 4,394,587 | 7/1983 | McKenzie et al. . |

OTHER PUBLICATIONS

Proceedings of the IEEE, vol. 71, No. 81, Aug. 1983, "Technological Design Considerations for Monolithic MOS Switched-Capacitor Filtering Systems", David J. Allstot & William C. Black, Jr., pp. 967–986.

*Primary Examiner*—John Zazworsky
*Attorney, Agent, or Firm*—Nixon & Vanderhye

[57] ABSTRACT

A CMOS limiter with input hysteresis, responsive to an input signal of varying amplitude, produces an output signal which changes between at least first and second levels, the transitions occurring when the absolute value of the amplitude of the input signal exceeds predetermined reference level. The limiter is fabricated on a single integrated circuit using CMOS switched capacitor techniques. An SC switching array selects between sampled input signal and an inverted sampled input signal depending upon the value of the output signal produced by the limiter. A comparing network (comprising an active CMOS comparator responsive to a difference signal produced at a summing node) changes the level of the output signal of the limiter when the selected signal exceeds a predetermined reference value. The summing node includes a signal level storing device (i.e. a precision capacitor) for storing the reference level during the period in which the input signal is sampled. The input offset voltage of the comparator is subtracted from the selected signal to reduce the output error of the comparator due to non-zero input offset voltage. The limiter includes a clock signal generator and sequential logic responsive to the clock signal generator for synchronizing the switching of the various switched capacitor switching elements in order to provide hysteresis.

28 Claims, 4 Drawing Figures

ADJUSTABLE CMOS HYSTERESIS LIMITER

FIELD OF THE INVENTION

The invention is related to circuits providing limiting of a variable input signal. In particular, the invention is related to an integrated circuit CMOS device for limiting the absolute value of the level of a variable input signal while providing input hysteresis.

BACKGROUND OF THE INVENTION

One of the methods used in the past to reduce the effect of noise present in the input signal of a comparator and to permit precise control of the comparator trip point is to introduce hysteresis feedback in the comparator circuit. See, e.g. Graeme, Jerald G., *Designing with Operational Amplifiers*, 60–62 (McGraw-Hill Book Co. 1977). A hysteresis control signal is typically switched (through a diode) to the comparator input. Switching occurs dependent upon the output of the comparator. Trip-point errors are reduced by the introduced hysteresis. Unfortunately, such diode clipper circuits are incompatible with CMOS technologies. Monolithic hysteresis comparators employing bipolar junction transistors and introducing hysteresis through emitter feedback are also known. See, e.g. U.S. Pat. No. 3,998,595 to Eatock (issued Oct. 26, 1976).

Another method known in the art for reducing errors in a comparator circuit is to use a chopper stabilized A-C coupled amplifier as a buffer. The output of the buffer is switched between the two inputs of a comparator. The output of the comparator is responsive to the difference in potential between the two inputs. Such a scheme is disclosed in U.S. Pat. No. 4,237,390 to Buurma (issued Dec. 2, 1980). This reference also discloses a coupling capacitor for coupling the buffer amplifier to the switched input. A switch is arranged to periodically connect the output of the comparator to the input of the comparator to drive the comparator to the trip point. The circuit taught by the Buurma reference reduces the effect of input capacitance on the operation of the comparator.

Switching comparators implemented in CMOS technology are disclosed in McGrogan, Jr. (U.S. Pat. No. 3,676,702, issued July 11, 1972) and Aoki et al (U.S. Pat. No. 4,211,942, issued July 8, 1980). Such known CMOS switching comparators require multiple active stages operating at linear operating points (operational amplifiers), thus requiring relatively large amounts of power and introducing error in the comparator output.

CMOS differential comparators utilizing hysteresis to decrease the effect of noise on the comparator output are disclosed in U.S. Pat. No. 4,394,587 to McKenzie et al (issued July 19, 1983) and U.S. Pat. No. 4,110,641 to Payne (issued Aug. 29, 1978). The circuits disclosed in these references likewise have substantial power supply requirements due to utilization of several active elements operating at linear operating points.

Other exemplary prior art patents of possible general interest to differential amplifiers MOS sense amplifiers, CMOS switched circuits and signal magnitude measurements are:

U.S. Pat. No. 3,660,774 to Eachus (1972);
U.S. Pat. No. 4,375,039 to Yamauchi (1983); and
U.S. Pat. No. 4,323,887 to Buurma (1982).

U.S. Pat. No. 4,068,138 to Miyakawa et al (issued Jan. 10, 1978) discloses a single converter which compares a varying input voltage with a predetermined reference voltage. The operational amplifier has negative and positive input terminals and generates an output voltage signal in proportion to the difference between the voltages applied to its two input terminals. When the input voltage is less than the reference voltage, one group of electronic switches turns on, so that the input voltage and the reference voltage are applied to the negative and the positive input terminals of the operational amplifier, respectively. When the input voltage is greater than the reference voltage, the other group of the electronic switches turns on, so that the input voltage and the reference voltage are applied to the positive and the negative input terminals of the operational amplifier, respectively. The input voltage is thereby converted into an output voltage in absolute value.

The relatively recent development of CMOS switched-capacitor technology provides a way to incorporate on a single integrated circuit a high density of switching, resistive, capacitive and linear amplifier elements having very low power consumption. Moreover, the development of techniques for fabricating capacitive and resistive elements to precise values (such as, for example, by fabricating precision MOS capacitive elements wherein the ratio of two MOS capacitors defines the value of the element) has permitted the development of circuits comprising components having excellent temperature and voltage stability coefficients as well as component value which may be accurately and precisely specified. Such technology has been particularly applied in monolithic signal filtering applications. See, e.g., Allstot et al, *TECHNOLOGICAL DESIGN CONSIDERATIONS FOR MONOLITHIC MOS SWITCHED-CAPACITOR FILTERING SYSTEMS* (Proceedings of the IEEE, Vol. 71, No. 8, August 1983).

SUMMARY OF THE INVENTION

The present invention is a CMOS limiter responsive to an input signal with varying amplitude for producing an output signal which changes between at least a first and a second level. The transition in the output signal occurs when the absolute value of the amplitude of the input signal exceeds a predetermined reference level.

The limiter samples the input signal and inverts the sampled input signal. The sampling and inverting may be performed by MOSFET (metal oxide semiconductor field effect transistor) switching elements and precision capacitors. A switching array (comprised of MOSFET switching elements) selects between the sampled input signal and the inverted sampled input signal depending upon the value of the output signal produced by the limiter.

A comparing network sets the output signal of the limiter to the first level when the selected signal exceeds the predetermined reference value and sets the output signal of the limiter to the second level when the selected signal is less than the negative of the predetermined reference value. The comparing network may include a summer for summing the selected signal with the predetermined reference level. This summer may alternately receive the predetermined reference level and the selected signal, and may include a signal level storing means for storing the reference level and a summing node for producing a signal level proportional to the difference between the selected signal and the predetermined reference level.

A CMOS-implemented active (operational amplifier) comparator responsive to the difference signal produced by the summing node may be used to produce a signal when the difference signal exceeds ground potential. The input offset voltage of the active comparator may also be subtracted from the selected signal in order to reduce the output error of the comparator due to non-zero input offset voltage. The input offset voltage may be applied to the summing node during the interval when the input signal is being sampled.

The limiter may further include a clock generator for producing a clock signal and sequential logic responsive to the clock signal and to the output of the comparator for producing the output signal of the limiter and for controlling the synchronization of the various switching elements.

Because of the advantages provided by switched capacitor CMOS techniques, the fixed reference level may be set very precisely. Only a single linear operational amplification stage (the comparator) is used, so that the limiter has very low power consumption. The input offset voltage of the comparator is nulled out, so that output error is reduced substantially. Finally, the entire limiter circuit may be fabricated on a single CMOS integrated circuit chip.

BRIEF DESCRIPTION OF THE DRAWINGS

A more completed understanding of this invention and appreciation of its improvements and advantages may be obtained from the following detailed description and accompanying drawings, of which.

DETAILED DESCRIPTION OF THE PREFERRED EMBODIMENT

Figures 2A, 2B:
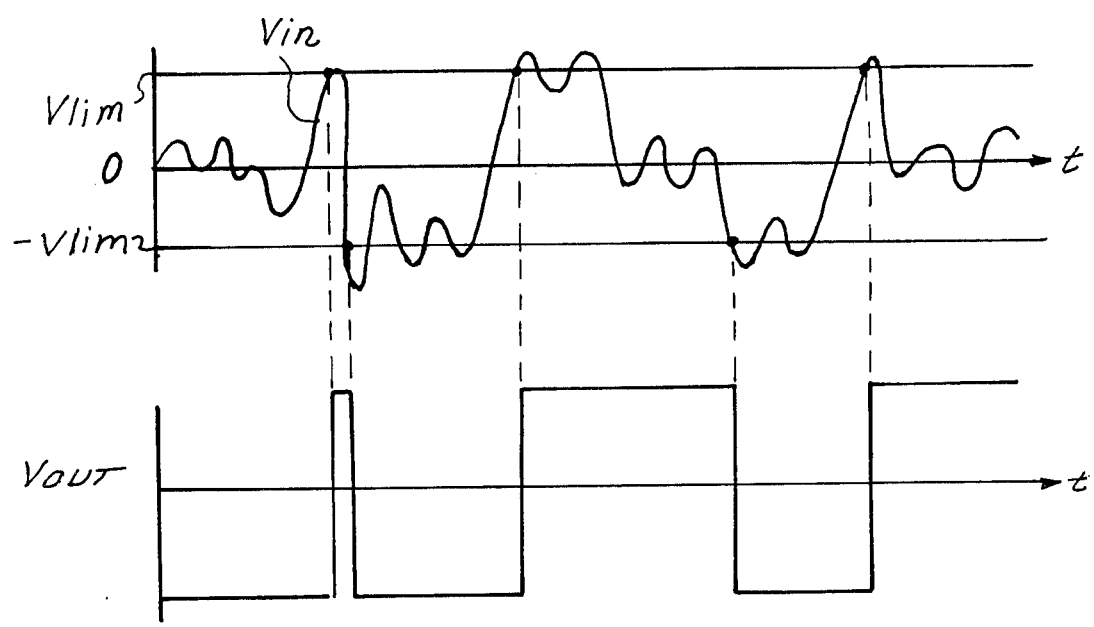
FIGS. 2(a)–2(b) are graphical illustrations of the input and the output voltages of the embodiment shown in FIG. 1.

The present invention provides voltage limiting, within a predetermined "window," of a varying input signal. FIGS. 2(a)–2(b) show the relationship between the input and output signals of a limiter in accordance with the present invention. The output of the limiter changes state only when the input $V_{in}$ satisfies the following:

$$|V_{in}| < V_{lim}$$

(where $V_{lim}$ is a reference voltage of a predetermined level). In other words, the output signal $V_{out}$ changes state whenever either $V_{in} < V_{lim}$ or $V_{in} > -V_{lim}$ (the present invention may hence be described as an infinite gain limiter).

The output $V_{out}$ of the limiter should not change state for $|V_{in}| \leq V_{lim}$, but rather should retain its latest value. Once $V_{out}$ changes state for $V_{in} > V_{lim}$, $V_{out}$ will not again change state until $V_{in} < -V_{lim}$. Likewise, once $V_{out}$ changes state for $V_{in} < -V_{lim}$, $V_{out}$ will not again change state until $V_{in} > V_{lim}$. $V_{out}$ is graphically illustrated in FIG. 2(b) for an arbitrary input signal $V_{in}$ shown in FIG. 2(a).

Figure 1:
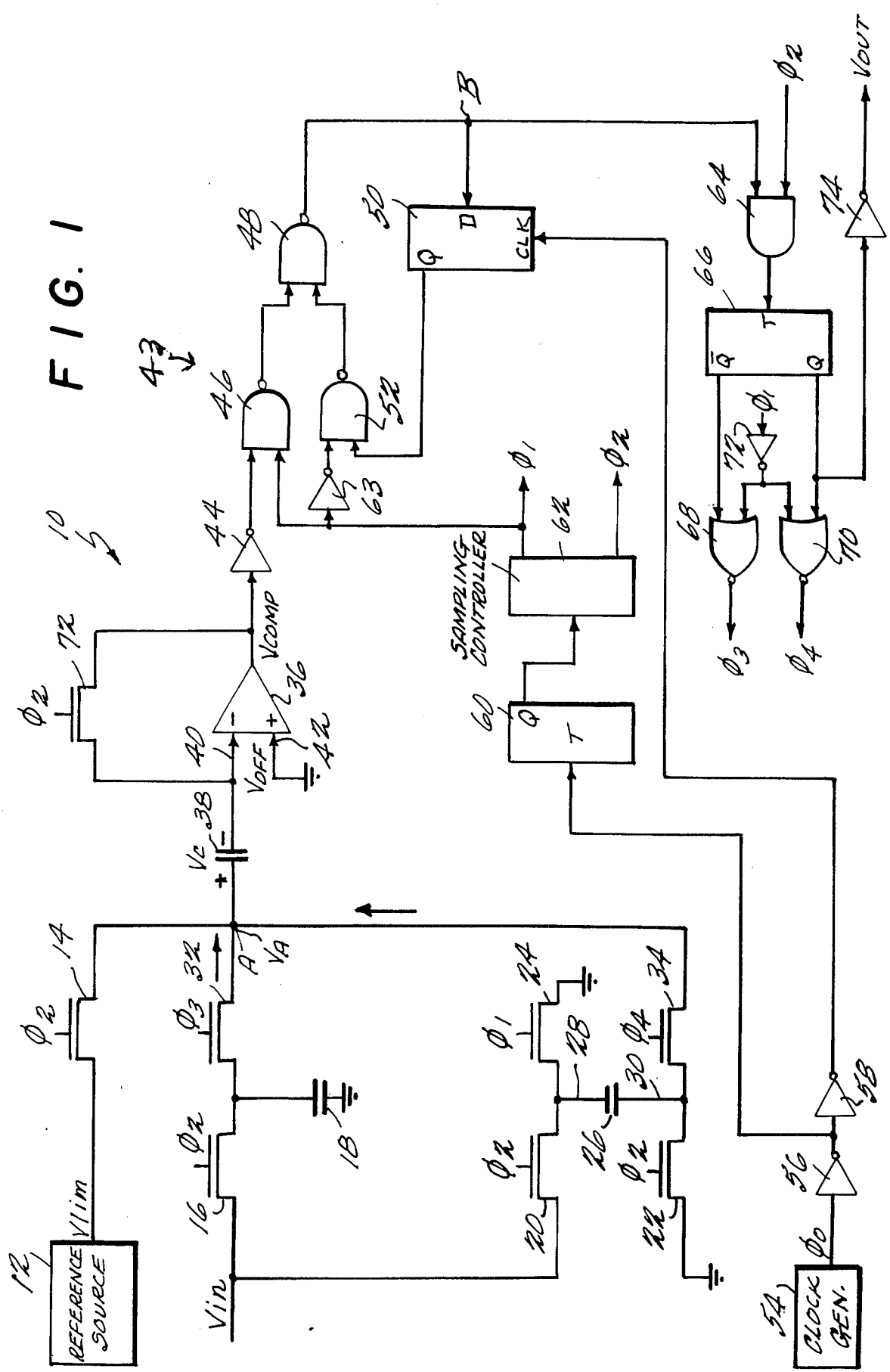
FIG. 1 is a schematic diagram of a presently preferred exemplary embodiment of the present invention.

A schematic diagram of the presently preferred exemplary embodiment of a limiter 10 in accordance with the present invention is shown in FIG. 1. One preferred embodiment of limiter 10 is fabricated on a single integrated circuit chip using any conventional double poly CMOS technology. A reference source 12 and a clock generator 54 may be external to the monolithic limiter 10 for added flexibility in controlling the operating parameters of the limiter.

A reference source 12 (typically a variable, highly-stable reference voltage source) produces a predetermined reference signal $V_{lim}$, which determines the input voltage level at which transitions of the output voltage of the limiter occur. $V_{lim}$ is selectively applied to a summing node A by a MOSFET switching element 14 when a signal $\phi_2$ is high (i.e. logic level 1).

$V_{in}$ (the input signal to be limited) is sampled by a MOSFET switching element 16 and a capacitor 18. Switching element 16 applies $V_{in}$ to capacitor 18 when signal $\phi_2$ is high. $V_{in}$ is also sampled and inverted by MOSFET switching elements 20, 22 and 24 and a capacitor 26. When the signal $\phi_2$ is high, $V_{in}$ is applied to a first connection 28 of capacitor 26 through MOSFET switching element 20, while a second connection 30 of the capacitor is connected to ground potential through MOSFET switching element 22. When a signal $\phi_1$ is high, first connection 28 of capacitor 26 is grounded to ground potential, and the inverted sampled $V_{in}$ may be obtained from second connection 30 of the capacitor. $\phi_1$ and $\phi_2$ are non-overlapping (i.e. they are never high simultaneously).

The values of capacitors 18 and 26 should be chosen to be small enough to permit charging during the interval when the control signals are high, yet large enough to minimize the effect of clock feedthrough offsets (i.e. voltage offsets produced by storage of clock signals in the capacitance between capacitor 18 and switching elements 16 and 32 and between capacitor 26 and its associated switching elements) and charge injection due to the MOSFET transmission gates. Capacitors 18 and 26 have equal capacitance in the preferred embodiment to balance the effect of errors which may be introduced.

A first switching network comprising MOSFET switching element 32 and a MOSFET switching element 34 selectively apply one of the sampled signal level of $V_{in}$ (stored on capacitor 18) and the sampled inverted signal level of $V_{in}$ (stored on capacitor 26) to summing node A. Switching element 32 applies sampled $V_{in}$ to summing node A when a signal $\phi_3$ is high, while switching element 34 applies inverted sampled $V_{in}$ to summing node A when a signal $\phi_4$ is high. Summing node A comprises a simple hard-wired connection of switching elements 14, 32 and 34 and a capacitor 38. The relationship between $\phi_1$, $\phi_2$, $\phi_3$, and $\phi_4$ will be explained in greater detail shortly.

A comparator network including an active CMOS comparator 36 and capacitor 38 are connected to summing node A. The "−" input 40 of comparator 36 is connected to summing node A via capacitor 38, while the "+" input of the comparator is connected to ground potential. Comparator 36 is a conventional CMOS comparator which produces an output signal $V_{comp}$ which is low (i.e. assumes logic level "0") when the signal applied to input 40 is greater than the signal applied to input 42, and is high (i.e. assumes logic level "1") when the signal applied (i.e. assumes logic level "1") when the signal applied to input 40 is less than the signal applied to input 42. Thus, $V_{comp}$ will be low if $V_A$ (the voltage level at node A) exceeds $V_c$ (the voltage across capacitor 38). $V_{comp}$ will be high when $V_c > V_a$.

The output of comparator 36 is applied to a sequential digital logic circuit 43 which produces output signal $V_{out}$ of limiter 10 and controls the states of switching elements 32 and 34.

$V_{comp}$ is applied to the input of a conventional digital logic inverter 44. The output of inverter 44 is applied to one of the two inputs of a NAND gate 46. The output of NAND gate 46 is applied to one of the inputs of a two-input NAND gate 48. The output of NAND gate 48 is applied to the D input of a D-type conventional flip flop 50, the Q output of which is applied to an input of a two-input NAND gate 52. The output of NAND gate 52 is applied to the other input of NAND gate 48.

A clock generator 54 produces a periodic clock signal $\phi_0$. In the preferred embodiment, clock generator 54 is a conventional free-running square wave oscillator operating at a fixed frequency. The frequency of clock generator 54 is chosen to be high enough to minimize the effect of leakage of capacitors 18, 26 and 38 on circuit performance as well as to handle the input frequency range of $V_{in}$. The output of clock generator 54 is applied to the input of an inverter 56. The output of inverter 56 is applied to the input of an inverter 58 and to the T input of a falling-edge sensitive T-type flip flop 60. The output of inverter 58 is used to clock flip flop 50, while the output of inverter 56 is used to control the state transitions of flip flop 60. As is well known, every time the signal applied to the T input of flip flop 60 changes from a logic 1 to a logic 0, the Q output of the flip flop is complemented. Flip flop 60 thus functions to divide the frequency of $\phi_0$ by two. As will be explained, flip flop 50 maintains the present output of NAND gate 48 during periods in which the output of comparator 36 ($V_{comp}$) is undefined whenever $\phi_2$ is high.

The Q output of flip flop 60 is applied to a sampling controller block 62 which produces two non-overlapping clock signals $\phi_1$ and $\phi_2$ (discussed earlier). $\phi_1$ and $\phi_2$ are non-overlapping clock signals in that they never assume logic level 1 simultaneously. In the preferred embodiment, $\phi_1$ and $\phi_2$ are the complements of one other. Sampling controller block 62 is of conventional design, and, in the preferred embodiment, comprises a combinational logic array which produces non-overlapping $\phi_1$ and $\phi_2$ each of which are at the same frequency as the signal produced at the Q output of flip flop 60. $\phi_1$ is applied to the other input of NAND gate 46 directly and through the other input of NAND gate 52 through an inverter 63.

The output of NAND gate 48, in addition to being applied to the D input of flip flop 50, is also applied to an input of a two-input AND gate 64. The other input of AND gate 64 is connected to $\phi_2$, while the output of the AND gate is connected to the T input of a positive edge triggered T flip flop 66. AND gate 64 gates the output of NAND gate 48 with $\phi_2$ to reduce the possibility of "glitches" or other transients causing flip flop 66 to change state. The $\overline{Q}$ output of flip flop 66 is connected to an input of a two-input NOR gate 68, while the Q output of the flip flop is connected to an input of a two-input NOR gate 70. The other input of each of NOR gates 68 and 70 are connected in common and to the output of an inverter 72. The input of inverter 72 is connected to $\phi_1$.

The Q output of flip flop 66 is also connected to the input of an inverter 74, the output of which is the output signal of limiter circuit 10 ($V_{out}$).

Figure 3:
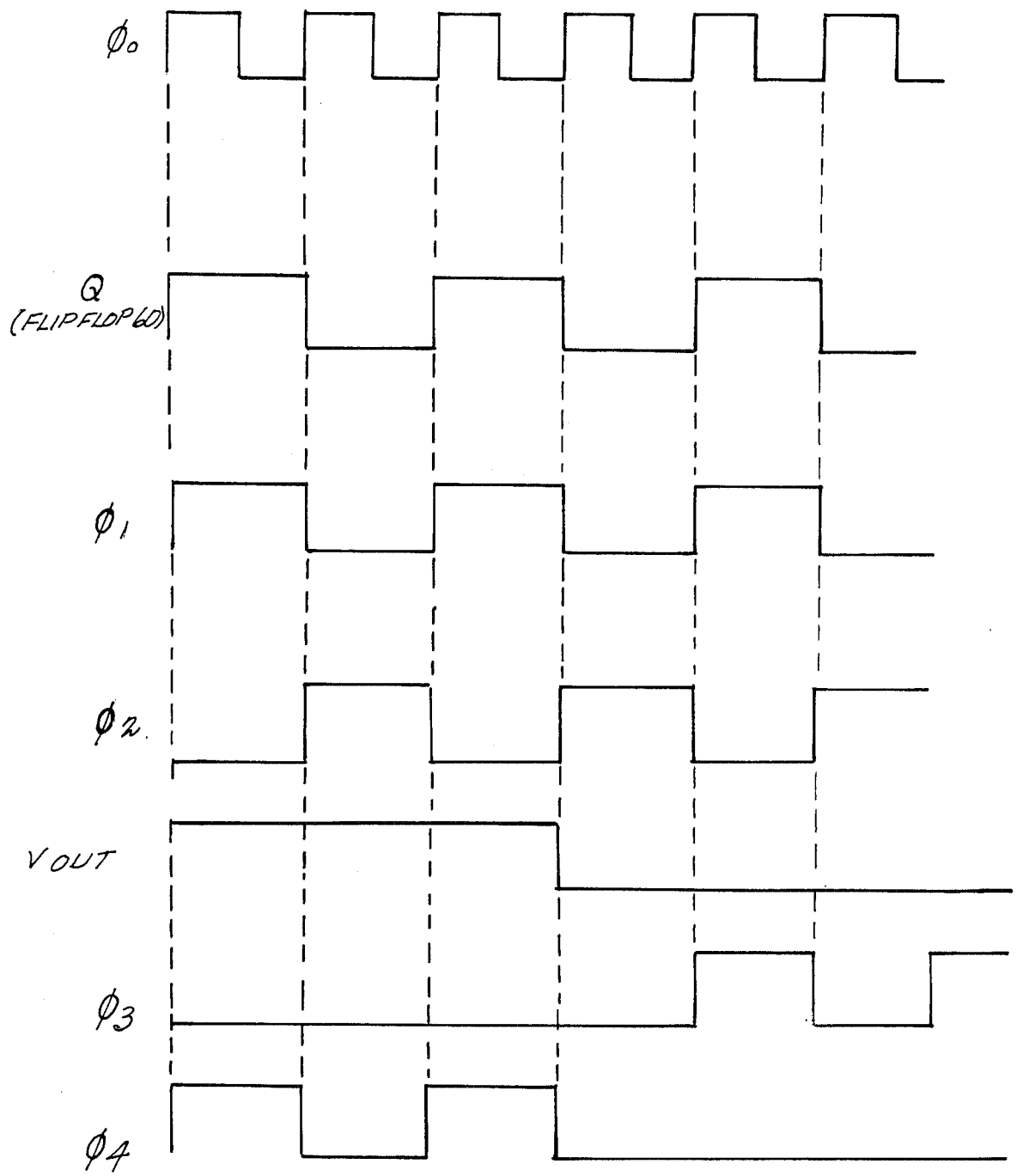
FIG. 3 is a timing diagram showing the relationship between various signals produced by the embodiment shown in FIG. 1.

The operation of the presently preferred exemplary embodiment shown in FIG. 1 may be better understood by observing the timing diagram shown in FIG. 3. $V_{in}$ is sampled during the interval when $\phi_2$ is high, and is stored on capacitors 18 and 26. Depending upon the level of the output of T-flip flop 66, either the (non-inverted) signal stored on capacitor 18 or the (inverted) signal stored on capacitor 26 is selected and connected to summing node A. Hysteresis is provided by controlling when the various MOSFET switching elements are switched in relation to one another.

$V_{lim}$ is summed with the signal selected by one of MOSFET switching elements 32 and 34 at summing node A. When $\phi_2$ is high (and thus, $\phi_1$ is low), $V_{lim}$ is applied to and stored by capacitor 38. Simultaneously, $V_{in}$ is applied to capacitors 18 and 26 when $\phi_2$ is high. As is shown in FIG. 3, $\phi_3$ and $\phi_4$ may be high ony when $\phi_2$ is low, so that $V_{in}$ is never applied directly to summing node A, nor is $V_{lim}$ ever directly applied to capacitors 18 and 26.

It will be understood that when $\phi_2$ is high, the output $V_{comp}$ of comparator 36 goes to an unknown (undefined) level. NAND gates 46, 52 and 48, inverters 44 and 63 and flip flop 50 serve to propagate $V_{comp}$ through to the input of NAND gate 64 only when $V_{comp}$ assumes a defined level (i.e. when $\phi_2$ is low).

When $\phi_1$ is high, switching elements 14, 16, 20 and 22 act as open circuits, and switching element 24 acts as a closed circuit. Thus, one of the signal levels stored on capacitor 18 and capacitor 26 (the latter available from connection 30 of capacitor 26) is applied to summing node A when one of $\phi_3$ or $\phi_4$ is high. During this time, connection 28 of capacitor 26 is connected to ground by switching element 24. Also during this time, $V_{lim}$ (stored on capacitor 38) is subtracted from the selected one of the voltages stored on capacitors 18 and 26.

$\phi_3$ is high only when $\phi_1$ is high and $V_{out}$ is low. When $\phi_3$ is high, $V_{in} - V_{lim}$ is applied to input 40 of comparator 36, causing $V_{comp}$ to be low only when $V_{in} > V_{lim}$. Likewise, $\phi_4$ is high only when $V_{out}$ is high and $\phi_1$, is high. When $\phi_4$ is high, $-V_{in} - V_{lim}$ is applied to input 40 of comparator 36, so that $V_{comp}$ will be low only if $V_{in} < -V_{lim}$ (i.e. $V_{in}$ is inverted and compared with positive $V_{lim}$). $V_{out}$ changes state only when $V_{comp}$ is low and a leading edge of $\phi_2$ occurs.

Because flip flop 66 is triggered by the positive edge of the output NAND gate 64, flip flop 66 will change state the next time $\phi_2$ is high and the output of NAND gate 48 is high. When flip flop 66 changes state, the opposite one of $\phi_3$ and $\phi_4$ than the one high in the previous state is made high (as gated by $\phi_1$). In this way, the signal level stored on a different one of capacitors 18 and 26 is applied to summing node A. A search for the next "window excursion" is thus carried out.

As is well known, mismatches in the input circuit of comparator 36 may result in a non-zero input offset voltage. Input offset voltage ($V_{off}$) is the voltage which must be applied to lead 40 of comparator 36 to cause the comparator to sense that equal signal levels applied to leads 40 and 42 are exactly equal. As is well known, $V_{off}$ has, in general, an unknown value which fluctuates with several factors (such as temperature, power supply voltage, etc.). To compensate for this non-zero input offset voltage, a MOSFET switching element 72 is connected between the output of comparator 36 and the input 40 of the comparator. Switching element 72 is triggered by $\phi_2$. Thus, $V_c$ (the voltage across capacitor 38) is in fact $V_{lim} - V_{off}$ (where $V_{off}$ is the non-zero input offset voltage of comparator 36). Comparator 36 is compensated for a non-zero $V_{off}$, resulting in more accurate operation.

The limiter circuit 10 shown in FIG. 1 may be fabricated on a single integrated circuit chip. In the preferred embodiment, switched capacitor techniques are used to implement the switching elements (14, 16, 20, 22, 24, 32, 34 and 72) and capacitors (18, 26 and 38).

Although only one exemplary embodiment has been described in detail above, those skilled in the art will appreciate that many variations and modifications may be made in this exemplary embodiment without departing from the novel and advantage features of this invention. For instance, although switching elements 14, 16, 20 22, 24, 32, 34 and 72 are shown as simple N-MOS-FETs, they can each comprise a transmission gate having both an n-channel and a p-channel switch in order to increase the dynamic range (signal handling capability) of limiter 10 (of course, the p-channel switches would be controlled by the inverse of the corresponding n-channel switch control signals). Likewise, while the circuitry used in the preferred embodiment for producing $\phi_1$, $\phi_2$, $\phi_3$, and $\phi_4$ is implemented by CMOS digital logic elements, it would be understood that many other implementations (such as a transmission gate and capacitor or a programmed microprocessor implementation) are possible. Moreover, capacitor 38 could be used to store the level of $V_{in} - V_{off}$ (or $-V_{in} - V_{off}$) rather than $V_{lim}$ (provided that the arrangement of the various switching elements was changed to accommodate such a configuration). Also, $V_{lim}$ could be made variable and applied at different levels depending upon the current limiter output, thus increasing the amount of hysteresis control. In addition to double poly, poly-to-diffusion or metal-to-diffusion capacitors could be used with care taken as to the extra stray capacitance associated with such structures. Accordingly, these and all other such variations and modifications are intended to be included within the scope of the following claims.

What is claimed is:

1. An electrical signal limiter with hysteresis, said limiter comprising:
    a voltage comparator having first and second inputs and an output, said comparator having two different output states depending upon which of its inputs is at the higher relative voltage and having said first input connected to a reference voltage point;
    a first switched capacitor means for storing a sample of a limiting voltage $V_{lim}$;
    a second switched capacitor means for storing a sample of an input voltage $V_{in}$;
    a third switched capacitor means for storing an inverted sample of the input voltage, that is $-V_{in}$; and
    sampling control means connected to said output of the voltage comparator and to said first, second and third switched capacitor means for alternatively connecting either said first and second or said first and third switched capacitor means in circuit with the second input of the voltage comparator as required to cause a change of state in the comparator output when $|V_{in}| > V_{lim}$.

2. An electrical signal limiter with hysteresis as in claim 1 wherein said first switched capacitor means includes offset switch means connected between the comparator output and its second input for sensing and also simultaneously storing any offset voltage $V_{off}$ associated with the comparator's operation in the first switched capacitor means.

3. A limiter as in claim 2 wherein:
    said second switched capacitor means includes first input signal level storing means for storing the level of said sampled input voltage $V_{in}$; and
    said third switched capacitor means includes second input signal level storing means for storing the negative of the level of said sampled input voltage $-V_{in}$.

4. A CMOS limiter as in claim 3 wherein:
    said second switched capacitor means further includes first input switching means for periodically applying said input voltage to said first input signal level storing means; and
    said third switched capacitor means further includes second input switching means for periodically applying said input signal to said second input signal level storing means.

5. A CMOS limiter as in claim 4 wherein:
    said second input signal level storing means comprises a MOS precision capacitive element having first and second plates; and
    said third switched capacitor means further comprises:
    first inverter switching means for periodically connecting the first plate of said capacitive element to ground potential, said first plate also coupled to said second input switching means, said first input switching means connecting said first plate to said input voltage and said first inverter switching means connecting said first plate to ground potential in alternating sequence in response to signals produced by said sampling control means; and
    second inverter switching means for periodically connecting the second plate of said capacitive element to ground potential, said second plate also connected to said first switching means, said first switching means connecting said second plate to said first input of said comparator and said second inverter switching means connecting said second plate to ground potential in alternating sequence in response to said signals produced by said sampling control means.

6. A limiter as in claim 5 wherein said first and second input switching means apply said input signal to said first and second input signal level storing means, respectively, during the same periodic time interval.

7. A limiter as in claim 4 wherein said first and second input siwtching means apply said input signal to said first and second input signal level storing means, respectively, during the same periodic time interval.

8. A limiter as in claim 4 wherein said sampling control means includes:
    selection control means, responsive to said ouput of said voltage comparator, for producing first and second control signals, the production of said first control signal and the production of said second control signal being mutually exclusive;
    first selection switching means, responsive to said first control signal, for applying the signal stored by said first input signal level storing means in circuit with the second input of the voltage comparator; and
    second selection switching means, responsive to said second control signal, for applying the signal stored by said second input signal level storing means in circuit with the second input of the voltage comparator 9. A limiter as in claim 8 wherein:
said sampling control means further includes means for producing a sampling control signal, said sampling control signal specifying the periodic time intervals during which said first and second input switching means apply said input signal to said first and second input signal level storing means, respectively; and
said selection control means includes means responsive to said sampling control signal for gating said first and said second control signals with the inverse of said sampling control signal to prevent said sampling control signal and one of said first and second control signals from being produced simultaneously.

10. A limiter as in claim 9 wherein said sampling control means further comprises:
clock generator means for producing a periodic clock signal; and
sequential logic means, responsive to said clock signal and to the signal produced by said comparator, for producing said output signal and said first and second control signals.

11. A limiter as in claim 1 further including summing means, connecting said first, second and third switched capacitor means together, for summing one of said stored voltages $V_{in}$ and $-V_{in}$ with said stored limiting voltage $V_{lim}$.

12. As limiter as in claim 2 wherein said offset switch means connects the output and the second input of said voltage comparator together during an interval when said limiting voltage is sampled by said first switched capacitor means.

13. A limiter as in claim 1 wherein said first input of the voltage comparator is connected to ground potential, ground potential being said reference voltage point.

14. A CMOS limiter, responsive to an input signal of varying amplitude, for producing an output signal which changes between at least first and second levels when the absolute value of the amplitude of said input signal exceeds a predetermined reference level, said limiter comprising:
sampling means for sampling said input signal;
sampling and inverting means for sampling and inverting said input signal;
first switching means, responsive to said output signal, for selecting said sampled input signal when said output signal is produced at said first level and for selecting said inverted sampled input signal when said output signal is produced at said second level;
summing means for summing said selected signal and said predetermined reference level together to produce a summed signal having a polarity; and
comparing means, connected to receive said summed signal, for changing the level of said output signal in response to said polarity of said summed signal.

15. A CMOS limiter as in claim 14 wherein said limiter further comprises:
reference signal level storing means for storing the level of said predetermined reference level;
second switching means for periodically applying said predetermined reference level to said reference signal level storing means; and
summing node means, connecting said first switching means and said second switching means to said reference signal level storing means, for producing a signal level proportional to the difference between said selected signal and said stored predetermined reference level.

16. A CMOS limiter as in claim 15 wherein said first and said second switching means alternately apply said selected signal and said predetermined reference level, respectively, to said summing node means.

17. A CMOS limiter as in claim 16 wherein:
said first switching means includes means for producing a sampling control signal, said sampling control signal specifying the periodic time intervals during which said first and second input switching means apply said input signal to said first and second input signal level storing means, respectively.

18. A CMOS limiter as in claim 17 wherein said comparing means further includes an operational amplifier, responsive to said difference signal, for producing a signal when said difference signal exceeds a second predetermined reference level.

19. A CMOS limiter as in claim 18 wherein said summing node means includes means for subtracting a signal proportional to the input offset voltage of said operational amplifier from said selected signal.

20. A CMOS limiter as in claim 18 wherein said second predetermined reference level is ground potential.

21. A CMOS limiter as in claim 18 wherein said comparing means further comprises:
a clock generator means for producing a periodic clock signal; and
sequential logic means, responsive to said clock signal and to the signal produced by said oprational amplifier, for producing said output signal and for controlling said first switching means to select one of said sampled input signal and said inverted sampled input signal.

22. A CMOS signal limiter with hysteresis comprising:
an operational amplifier (36) having one grounded input, one signal input and one output;
a first capacitor (38) connected at one end to said one signal input, a first controllable switch (72) connected across said output and signal input of the operational amplifier having an offset voltage $V_{off}$ and a second controllable switch (14) connected between the other end of said first capacitor at a summing node and a limiting reference voltage $V_{lim}$, said first and second controllable switches (72, 14) being simultaneously operable to store a reference voltage $V_{lim} - V_{off}$ across said first capacitor;
a second capacitor (18) having one end grounded, and its other end controllably connected to said summing node through a third controllable switch (32) operable to temporarily connect said first and second capacitors in series with the signal input of said operational amplifier;
a third capacitor (26) having one end controllably grounded through a fourth controllable switch (22) and its other end controllably grounded through a fifth controllable switch (24), its said one end also being controllably connected to said summing node through a sixth controllable switch (34);
said other end of the second capacitor and said other end of the third capacitor being controllable connected to an input signal voltage through a seventh controllable switch (16, 20); and control means connected to the output of said operational amplifier and to each of said controllable switches for causing said first, second, fourth and seventh controllable switches to operate simultaneously and in synchronous non-overlapping timed relationship with the alternate operations of either the third or the fifth and sixth controllable switches.

23. A CMOS limiter as in claim 22 wherein said seventh controllable switch comprises a first input controllable switch (16) and a second input controllable switch (20), a first end of said first and second input controllable switches commonly connected to said input signal voltage, the other end of said first input controllable switch connected to said other end of said second capacitor, the other end of said second input controllable switch connected to said other end of said third capacitor, said first and second input controllable switches operating simultaneously with said first, second and fourth controllable switches.

24. A CMOS limiter wherein as in claim 22 wherein said control means comprises:
    clock generator means for producing a periodic clock signal;
    sampling controller means, responsive to said clock signal, for producing a first and a second non-overlapping control signal, said first control signal operating said first, second, fourth and seventh controllable switches and said second control signal operating said fifth controllable switch;
    first gating means, responsive to said output of said operational amplifier and to said first control signal, for producing a signal which changes with a change in said output of said operational amplifier only when said second control signal is not present and otherwise corresponds to the output of said operational amplifier during the last interval when said first control signal was present;
    a flip flop (66) the input of which is connected to said signal produced by said first gating means, the flip flop changing state when the signal produced by said first gating means changes, said flip flop having first and second complementary outputs; and
    second gating means for gating each of said first and second outputs of said flip flop with said first control signal, said gated first output operating said third controllable switch, said gated second output operating said sixth controllable switch.

25. A signal processor including of:
    a signal comparator having first and second inputs and an output, said comparator having two different output states depending upon which of its inputs is at the higher relative voltage, said first input adapted to be connected to a reference signal point;
    a first storage means for storing a sample of a limiting signal $V_{lim}$;
    a second storage means for storing a sample of input signal $V_{in}$;
    a third storage means for storing an inverted sample of the input signal, that is $-V_{in}$; and
    sampling control means coupled to said output of the signal comparator and to said first, second and third storage means for alternately connecting either said first and second or said first and third storage means in circuit with the second input of the signal comparator as required to cause the signal comparator output to assume a first output state when $V_{in}$ and $V_{lim}$ are of a first combination of polarities and to assume a second state when $V_{in}$ and $V_{lim}$ are of a second combination of polarities.

26. A signal processor programmed to respond to an input signal of varying amplitude, for producing an output signal which changes between at least first and second levels when the absolute value of an amplitude of said input signal exceeds a predetermined reference level, said processor comprising:
    sampling means for sampling said input signal;
    sampling and inverting means for sampling and inverting said input signal;
    first switching means, responsive to said output signal, for selecting said sampled input signal when said output signal is produced at said first level and for selecting said inverted sampled input signal when said output signal is produced at said second level;
    summing means for summing said selected signal and said predetermined reference level together to produce a summed signal having a polarity; and
    comparing means, connected to receive said summed signal, for changing the level of said output signal in response to said polarity of said summed signal.

27. A method for producing an output signal, in response to an input signal of varying amplitude, which output signal changes between at least first and second levels when the absolute value of the amplitude of said input signal exceeds a predetermined reference level, comprising the steps of:
    producing an output signal at one of said first and second levels;
    sampling said input signal;
    sampling and inverting said input signal;
    selecting said sampled input signal when said output signal is produced at said first level;
    selecting said inverted sampled input signal when said output signal is produced at said second level;
    summing said selected signal and said predetermined reference level together to produce a summed signal having a polarity; and
    changing the level of said output signal in response to said polarity of said summed signal.

28. A method of processing signals comprising the steps of:
    applying a reference signal to a first input of a signal comparator having first and second inputs and an output, said comparator having two different output states depending upon which of its inputs is at the higher relative voltage;
    storing a sample of a limiting signal $V_{lim}$;
    storing a sample of an input signal $V_{in}$;
    storing an inverted sample of the input signal, that is $-V_{in}$; and
    alternating connecting either (a) said stored sample of said limiting signal $V_{lim}$ and said stored sample of said input signal $V_{in}$ or (b) said stored sample of said limiting signal $V_{lim}$ and said stored inverted sample of said input signal $-V_{in}$ in circuit with said second input of said signal comparator as required to cause the signal comparator output to assume a first output state when $V_{in}$ and $V_{lim}$ are of a first combination of polarities and to assume a second output state when $V_{in}$ and $V_{lim}$ are of a second combination of polarities.

\* \* \* \* \*